(12) United States Patent
Kim et al.

(10) Patent No.: US 8,845,918 B2
(45) Date of Patent: Sep. 30, 2014

(54) THERMOELECTRIC MATERIAL AND COMPOSITES MADE FROM THERMOELECTRIC MATERIAL AND A METHOD FOR FABRICATING THEREOF

(75) Inventors: Kyung Tae Kim, Daejon (KR); Gook Hyun Ha, Busan-si (KR); Dong Won Kim, Busan-si (KR)

(73) Assignee: Korea Institute of Machinery & Materials, Taejon (KR)

( * ) Notice: Subject to any disclaimer, the term of this patent is extended or adjusted under 35 U.S.C. 154(b) by 694 days.

(21) Appl. No.: 12/883,803

(22) Filed: Sep. 16, 2010

(65) Prior Publication Data

US 2011/0284804 A1 Nov. 24, 2011

(30) Foreign Application Priority Data

May 24, 2010 (KR) .................. 10-2010-0047880

(51) Int. Cl.
- H01B 1/04 (2006.01)
- H01B 1/18 (2006.01)
- H01L 35/22 (2006.01)
- H01L 35/26 (2006.01)
- H01L 35/34 (2006.01)
- C22C 1/02 (2006.01)

(52) U.S. Cl.
USPC ....... 252/62.3 T; 252/503; 252/502; 252/506; 977/742

(58) Field of Classification Search
USPC ............... 252/503, 502, 506, 62.3 T; 977/742
See application file for complete search history.

(56) References Cited

U.S. PATENT DOCUMENTS

| 7,365,100 | B2 * | 4/2008 | Kuper et al. | 516/32 |
| 8,257,678 | B2 * | 9/2012 | Steiner et al. | 423/447.3 |
| 2009/0029256 | A1 * | 1/2009 | Mah et al. | 429/231.8 |
| 2009/0042028 | A1 * | 2/2009 | Kim et al. | 428/367 |
| 2009/0169994 | A1 * | 7/2009 | Mah et al. | 429/218.1 |
| 2011/0108774 | A1 * | 5/2011 | Blank et al. | 252/506 |
| 2011/0159367 | A1 * | 6/2011 | Kim et al. | 429/219 |
| 2012/0094178 | A1 * | 4/2012 | Loveridge et al. | 429/217 |
| 2012/0175547 | A1 * | 7/2012 | Adams | 252/71 |

FOREIGN PATENT DOCUMENTS

| JP | 2004-087714 A | 3/2004 |
| KR | 10-2010-0028909 | 3/2010 |
| WO | WO 2009110815 A1 * | 9/2009 |

OTHER PUBLICATIONS

Office Action dated Sep. 11, 2012 in Japanese Application No. 2010-212871, filed Sep. 22, 2010.
Office Action dated Jan. 29, 2012 in Korean Application No. 10-2010-0047880, filed May 24, 2010.

* cited by examiner

*Primary Examiner* — Douglas McGinty
(74) *Attorney, Agent, or Firm* — Saliwanchik, Lloyd & Eisenschenk

(57) ABSTRACT

The thermoelectric material according to the present invention is characterized in that carbon nanotubes are dispersed in thermoelectric matrix powder by mechanically grinding, mixing, and treating by heating a mixed powder formed through a chemical reaction after mixing a first solution in which carbon nanotubes are dispersed and a second solution containing metallic salts. Further, a method for fabricating the thermoelectric material includes fabricating the first solution and the second solution, mixing the first solution and the second solution with each other to form a mixed solution, forming and growing a mixed powder in which carbon nanotubes and metals are mixed by a chemical reaction of the mixed solution, mechanically grinding and mixing the mixed powder, and heating the ground-and-mixed mixed powder to form the thermoelectric material. In addition, a composite can be made from the thermoelectric material by performing a spark plasma sintering process using the thermoelectric material, and has an improved thermoelectric efficiency due to the carbon nanotubes dispersed in the thermoelectric materials.

5 Claims, 7 Drawing Sheets

THERMOELECTRIC MATERIAL AND COMPOSITES MADE FROM THERMOELECTRIC MATERIAL AND A METHOD FOR FABRICATING THEREOF

CROSS-REFERENCE TO RELATED APPLICATION

The present application claims the benefit under 35 U.S.C. §119 of Korean Patent Application No. 10-2010-0047880, filed May 24, 2010, which is hereby incorporated by reference in its entirety.

BACKGROUND OF THE INVENTION

1. Field of the Invention

The present invention relates to a thermoelectric material having carbon nanotubes partly or fully embedded inside formed by mechanically pulverizing, mixing, and treating by heating mixed powder manufactured by a chemical reaction after mixing a first solution in which carbon nanotubes are dispersed and a second solution containing metallic salts and a method for fabricating the same.

2. Description of the Related Art

The thermoelectric material is an energy converting material wherein electric energy is generated when making a temperature difference between both ends of the material, and conversely, a temperature difference between both ends of the material is made when electric energy is given to the material.

Since the late 1930's, after thermoelectric phenomena such as Seebeck effect, Peltier effect, Thomson effect, etc. had been discovered, such thermoelectric materials have been developed as thermoelectric materials having high thermoelectric figure-of-merit along with the development of semiconductors. These thermoelectric materials are used as special power supply devices for backwoods, space, military, etc. using thermoelectricity generation, and are used for precise temperature control in semiconductor laser diodes, infrared detectors, etc. In addition, these thermoelectric materials are used as compact coolers related to computers, coolers for optical communication lasers, coolers for hot and cold water dispensers, semiconductor temperature regulating devices, heat exchangers, etc. using thermoelectric cooling.

To improve thermoelectric figure-of-merit of such thermoelectric materials, dimensionless figure-of-merit, value of $ZT=(\sigma\alpha^2/\kappa)T$ should be improved ($\alpha$: Seebeck coefficient, $\sigma$: electric conductivity, $\kappa$: thermal conductivity, T: absolute temperature).

High figure-of-merit of thermoelectric materials means high energy conversion efficiency, and to increase such figure-of-merit, it is required to increase electric conductivity and Seebeck coefficient or decrease thermal conductivity.

Generally, the electric conductivity and thermal conductivity of materials have characteristics depending on each other. That is, materials having low electric conductivities are known as ones having low thermal conductivities.

However, in case of thermoelectric materials, appropriate combination of high electric conductivity and low thermal conductivity is required as verified in the above figure-of-merit ZT. Since out of the properties affecting the figure-of-merit, the Seebeck coefficient and electric conductivity mainly depend on charges, and the thermal conductivity mainly depends on phonons, it is necessary to independently control thermal and electrical properties by control of microstructure considering the same.

More particularly, the figure-of-merit can be improved by inducing increase of charge mobility and charge density in thermoelectric materials and increase of phonons-scattering in the lattice forming thermoelectric materials.

In order to achieve good combination between thermal and electric properties, research for fabricating nanostructured thermoelectric materials with nano-sized grains or thermoelectric composites to which nanophases as dispersoids are added is recently in active progress to make thermoelectric materials having high figure-of-merit.

Nanostructured thermoelectric materials can control electric conductivity and thermal conductivity of materials independently through a characteristic that nano-grained materials having certain grain sizes maximize the scattering of phonons but make charges pass through.

In the same context, making thermoelectric materials into composites is known as a method for improving thermoelectric figure-of-merit in a way that nano-dispersoids form newly large interfaces causing more scattering of lattice-phonons resulting in reduction of thermal conductivity. As a result of this, figure-of-merit can be improved due to effectively reduced thermal conductivity of the composites.

Especially, since the performance of the thermoelectric composites can be controlled depending on kinds and sizes of nano-dispersoids, thermal and electric properties of thermoelectric materials can advantageously be controlled at the same time.

However, in most of the processes for fabricating the existing thermoelectric composites, metallic oxides are used as nano-dispersoids as disclosed in Korea laid-open patent No. 2001-0028909 and Korea Patent application No. 10-2008-0087859.

Accordingly, the scattering of phonons by nano-dispersoids of metallic oxides is effectively made and the electric conductivity is maintained or slightly decreased when nano-dispersoids are dispersed in size under 10 nm. However, it is not easy to completely remove agglomeration of nano-dispersoids under dozens of nanometers only by a mechanical milling process.

In L. Zhao et al., Journal of Alloys and Compounds 455 (2008) p 259-264, nano-dispersoids, metallic oxides, and SiC, which is a nonconductive ceramic particle, are used, but there is a problem in that the electric conductivity decreases because of the nonconductive ceramic particles.

Since such problems of agglomeration of nano-dispersoids and their low conductivity eventually make it difficult to effectively use dispersoids in thermoelectric matrix phases, it becomes hard to secure synergistic effect of realizing at the same time effects of nano-structuring and nano-dispersoids through composites.

TECHNICAL SOLUTION

An object of the present invention is to solve the existing problems, that is, to provide a thermoelectric material using carbon nanotubes as nano-dispersoids, and enable to realize nano-crystalline matrix material at the same time and a method for fabricating the same.

Another object of the present invention is to provide a thermoelectric material in which carbon nanotubes are embedded in the thermoelectric matrix powder synthesized through a chemical process to produce a mixed powder consisting of carbon nanotubes and flake-shaped thermoelectric powder, followed by mechanically grinding, mixing, and treating by heating the mixed powder.

Another object of the present invention is to provide composites made from a thermoelectric material, as raw material, having improved figure-of-merit ZT by decreasing thermal conductivity through scattering effect in response to dispersion of carbon nanotubes and increasing electric conductivity because of conductivity of carbon nanotubes by performing a spark plasma sintering process using a thermoelectric material as raw material.

The thermoelectric material according to the present invention is characterized in that carbon nanotubes are embedded inside by mechanically grinding, mixing, and treating by heating mixed powder formed through a chemical reaction after mixing a first solution in which carbon nanotubes are dispersed and a second solution containing metallic salts.

The thermoelectric material according to the present invention is characterized in that the above carbon nanotubes are multi-walled carbon nanotubes.

The thermoelectric material according to the present invention is characterized in that the above mixed powder surely comprises tellurium Te and bismuth Bi and comprises one or more of antimony Sb and selenium Se.

The thermoelectric material according to the present invention is characterized by containing 1 to 10% volume fraction of the above carbon nanotubes.

The composites made from the thermoelectric material according to the present invention is made by passing through the spark plasma sintering process the thermoelectric material in which part of carbon nanotubes are embedded inside through mechanical pulverization, mixture, and treatment by heating of mixed powder formed by a chemical reaction after mixing the first solution in which carbon nanotubes are dispersed and the second solution containing metallic salts.

Here, the above carbon nanotubes are multi-walled carbon nanotubes.

The method for fabricating the thermoelectric material according to the present invention is characterized by comprising a step of fabricating the first and the second solutions for fabricating the first solution in which carbon nanotubes are dispersed and the second solution containing metallic salts, a step of fabricating a mixed solution for fabricating a mixed solution by mixing the first solution and the second solution with each other, a step of fabricating mixed powder for synthesizing and growing of thermoelectric metal matrix powder in which carbon nanotubes and flake-shaped metals are homogeneously mixed by a chemical reaction of the above mixed solution, a step of grinding mixed powder for mechanically grinding and mixing the above mixed powder, and a step of fabricating thermoelectric material by heat treatment of the mixed powder homogeneously milled in the above step.

The method according to the present invention is characterized in that the above metallic salts surely comprise one or more of bismuth acetate (Bi acetate), bismuth chloride (Bi chloride), and bismuth nitrate ($BiNO_3$) and tellurium chloride (Te chloride), and further comprise one or more of antimony salt and selenium salt.

The first solution contains polar solvent comprising one or more of Dioctylether and Diphenylether.

The step of fabricating mixed powder consists of a chemical reaction process for forming thermoelectric material by elevating temperature of the above mixed solution up to 250° C. to 280° C. by 10° C. per minute and maintaining the temperature for 2 hours, and a process of fabricating mixed powder for fabricating mixed powder in which carbon nanotubes are homogeneously placed among the formed thermoelectric material.

The above second solution is characterized by comprising one or more of Oleylamine and Trioctylphosphine.

The step of grinding mixed powder is to make the mixed powder in the shape of flakes into that of circular shapes, and to make part of the carbon nanotubes separated from the metals to be inserted into the metals.

The step of fabricating the first and the second solutions is to fabricate the first solution by sequentially performing a process of purifying the carbon nanotubes, a process of functionalizing for forming functional groups in the above carbon nanotubes, an extraction process for extracting the above carbon nanotubes, and a dispersing process for dispersing the extracted carbon nanotubes in polar solvent with surfactant, and at the same time, to fabricate the second solution containing surely one or more of bismuth acetate (Bi acetate), bismuth chloride (Bi chloride), and bismuth nitrate ($BiNO_3$), tellurium chloride, reductant, and surfactant, and selectively one or more of selenium salt and antimony salt.

The step of fabricating thermoelectric material is a process for removing oxygen, oxides, and organic matters included in the mixed powder through heat treatment in reducing atmosphere.

The process of purifying is characterized in that the purification is performed in a solution in which sulfuric acid and nitric acid are mixed in 3:1 of volume ratio.

After the step of fabricating mixed powder, performed are a process of separating powder for separating the mixed powder and a process of drying powder for stopping oxidation reaction by heating the separated mixed powder in a vacuum at 80~100° C.

A method for composites made from the thermoelectric material according to the present invention is characterized by consisting of a step of fabricating a first and a second solutions for fabricating a first solution in which carbon nanotubes are dispersed and a second solution containing metallic salts, a step of fabricating mixed solution for fabricating mixed solution by mixing the first and second solutions, a step of fabricating mixed powder for forming and growing mixed powder in which carbon nanotubes and metals are mixed by chemically reacting the above solutions together, a step of grinding mixed powder for mechanically grinding and mixing the above mixed powder, a step of fabricating thermoelectric material for fabricating thermoelectric material by treating with heat the mixed powder ground and mixed in the above step, and a step of fabricating composites for fabricating bulked composites from the above thermoelectric material using the spark plasma sintering process.

The above metallic salts comprise surely one or more of bismuth acetate (Bi acetate), bismuth chloride (Bi chloride), and bismuth nitrate ($BiNO_3$) and tellurium chloride (Te chloride), and further comprise one or more of antimony salt and selenium salt.

The step of fabricating composites is a process of applying 30 to 70 MPa of pressure at 300 to 350° C. to sinter.

EFFECTIVENESS OF INVENTION

As described above, in thermoelectric material according to the present invention and composites made from the same, carbon nanotubes are dispersed inside.

Accordingly, the electric conductivity can be improved by high conductivity of carbon nanotubes, the Seebeck coefficient can be enhanced by the addition of carbon nanotubes that might cause high thermopower at the carbon nanotube/thermoelectric materials interface as well, and conversely, thermal conductivity can be reduced by dispersed carbon nanotubes which act as a phonon-scattering site, consequently improving the ZT value.

Conductive carbon nanotubes, through which the electric conductivity increases or is maintained, can be used as a raw material powder to fabricate thermoelectric materials having more improved thermoelectric efficiency than the case of using the existing nonconductive dispersed phases.

DETAILED DESCRIPTION OF THE INVENTION

Here, the structure of the thermoelectric material according to the present invention will be described referring to the attached FIG. 1.

Figure 1:
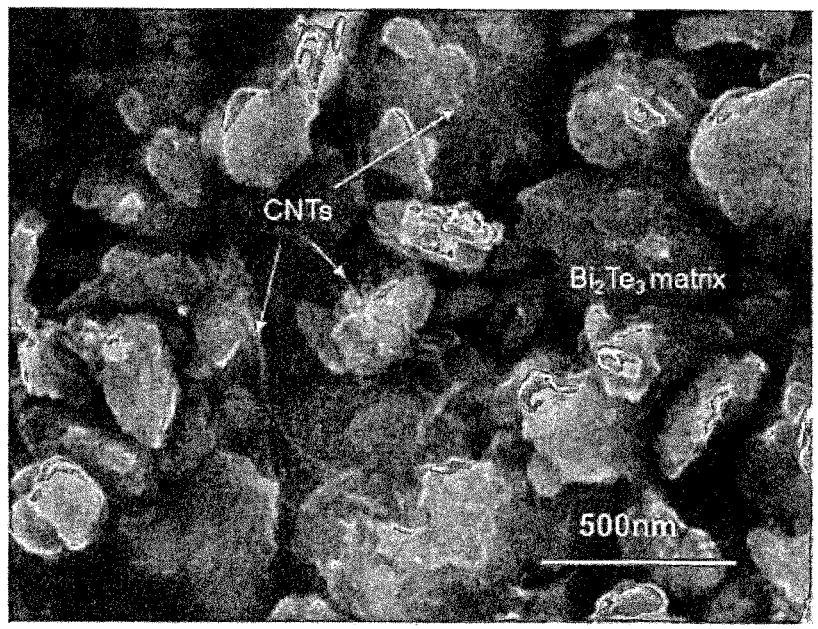
FIG. 1 is an enlarged photograph of a thermoelectric material according to the present invention.

FIG. 1 shows an enlarged photograph of the thermoelectric material according to the present invention.

The thermoelectric material according to the present invention, which comprises carbon nanotubes dispersed inside the nano-crystallized thermoelectric material, can realize characteristics of nano-dispersed phase and nano crystal boundary at the same time.

That is to say, the above thermoelectric material is made by mixing a first solution in which carbon nanotubes are dispersed and a second solution containing metallic salts, and mechanically grinding, mixing, and treating with heat mixed powder formed by a chemical reaction. The obtained thermoelectric material has a structure that part of the above carbon nanotubes is inserted inside.

In an embodiment of the present invention, multi-walled carbon nanotubes are used as the carbon nanotubes and their volume fraction is 1 to 10% in relation to the total volume of the thermoelectric material.

Further, the above thermoelectric material surely comprises tellurium Te and bismuth Bi and selectively comprises one or both of antimony Sb and selenium Se.

Hereinafter, the method for fabricating the above thermoelectric material is described referring to the FIGS. 2 to 4.

Figure 2:
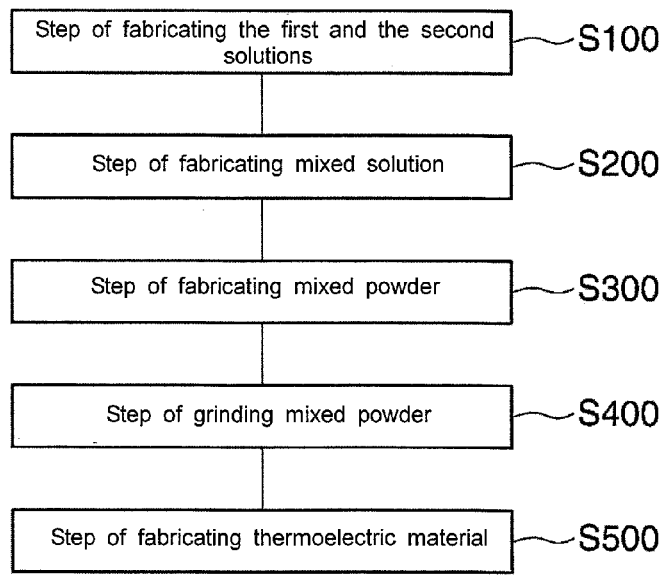
FIG. 2 is a flow chart of processes showing a method for fabricating the thermoelectric material according to the present invention.
Figure 3:
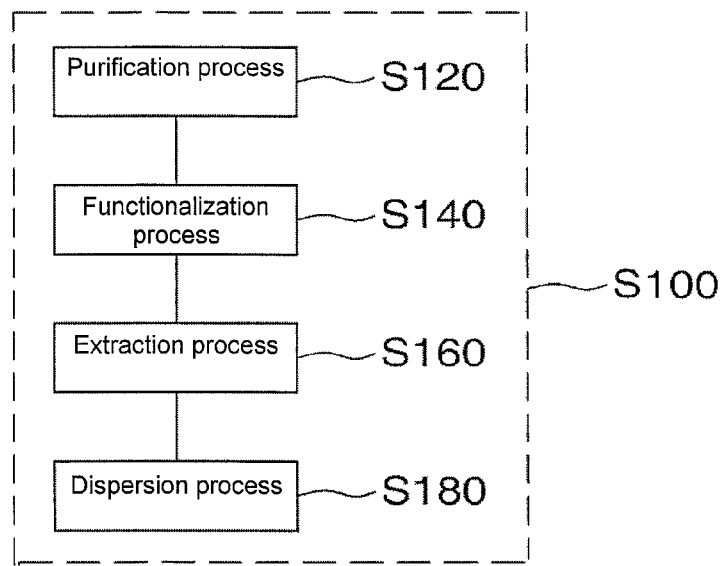
FIG. 3 is a flow chart of processes particularly showing a step of the method for fabricating the thermoelectric material according to the present invention, that is, a step of fabricating the first and the second solutions.
Figure 4:
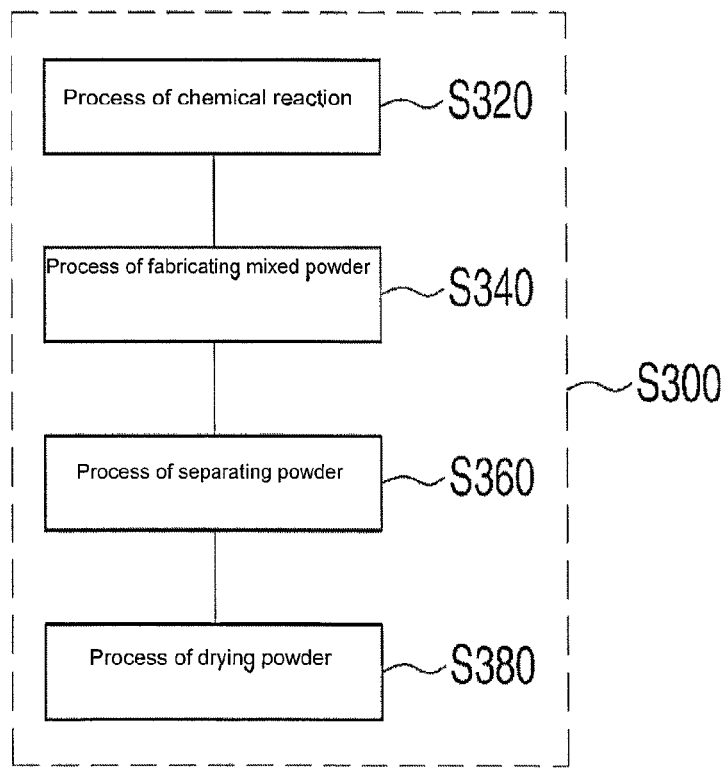
FIG. 4 is a flow chart of processes particularly showing a step of the method for fabricating the thermoelectric material according to the present invention, that is, a step of fabricating mixed powder.

FIG. 2 is a flow chart of processes showing a method for fabricating the thermoelectric material according to the present invention, FIG. 3 is a flow chart of processes particularly showing a step of the method for fabricating the thermoelectric material according to the present invention, that is, a step of fabricating the first and the second solutions, and FIG. 4 is a flow chart of processes particularly showing a step of the method for fabricating the thermoelectric material according to the present invention, that is, a step of fabricating mixed powder.

As shown in FIGS. 2 to 4, the thermoelectric material is fabricated by sequentially performing the step of fabricating the first and the second solutions S100 for fabricating the first solution in which carbon nanotubes are dispersed and the second solution containing metallic salts, the step of fabricating mixed solution S200 for fabricating mixed solution by mixing the first solution and the second solution, the step of fabricating mixed powder S300 for forming and growing mixed powder in which carbon nanotubes and metals are mixed by chemically reacting the above mixed solution, the step of grinding mixed powder S400 for mechanically grinding and mixing the above mixed powder, and the step of fabricating thermoelectric material for fabricating thermoelectric material through heat treatment of the mixed powder ground and mixed in the above step.

Examining each step in detail, the step of fabricating the first and the second solutions is to fabricate the first and the second solutions, which are raw materials for fabricating mixed solution to be made as mixed powder through a chemical reaction. The first and second solutions are separately fabricated, and the fabrication order does not matter.

That is, the above first solution is made by sequentially performing a purification process S120 for purifying the above carbon nanotubes, a functionalization process S140 for forming functional groups in the above carton nanotubes, an extraction process S160 for extracting the carbon nanotubes, and a dispersion process S180 for dispersing the extracted carbon nanotubes in Dioctylether solvent with surfactant.

The above purification process S120 is a process for purifying carbon nanotubes by soaking carbon nanotubes having 10~40 nm of diameters in HCl solution, and the functionalization process S140 for forming functional groups such as carboxyl groups is performed by inputting the purified carbon nanotubes in a solution in which sulfuric acid and nitric acid are mixed in volume ratio of 3:1 and performing ultrasonication.

The functionalized carbon nanotubes pass through the extraction process S160 using centrifugation and filtering, and then the carbon nanotubes are dispersed in the solvent through the dispersion process S180, so that fabrication of the first solution is completed.

Further, the above second solution contains metallic salts, reductant, and surfactant.

That is, the above metallic salts comprise one or more of bismuth acetate (Bi acetate), bismuth chloride (Bi chloride), and bismuth nitrate ($BiNO_3$) and tellurium chloride (Te chloride). In addition, one or both surfactants of Oleylamine and Trioctylphosphine are applied, and Hexadecanediol is applied as a reductant.

In addition, the above metallic salts of the second solution can comprise one or both of antimony salt and selenium salt.

The step of fabricating the first and the second solutions S100 is completed according to the above processes, then, the step of fabricating mixed solution S200 is performed.

The above step of fabricating mixed solution S200 is a process of fabricating mixed solution by mixing the first and the second solutions fabricated in the step of fabricating the first and the second solutions S100.

Accordingly, the above mixed solution comprises all, that is, carbon nanotubes, metallic salts, surfactant, and reductant.

After the above step of fabricating mixed solution S200, the step of fabricating mixed powder S300 for fabricating mixed powder from the above mixed solution is performed.

The above step of fabricating mixed powder S300 is a process for extracting thermoelectric phases of the mixed powder by heating the mixed solution to reduce metallic salts by a chemical reaction.

In the step of fabricating mixed powder S300 of an embodiment according to the present invention, the mixed powder is extracted by elevating temperature of the above mixed solution by 10° C. per minute up to 250° C. to 280° C. and maintaining the temperature for 2 hours.

More particularly examining the above step of fabricating mixed powder S300 and referring to the FIG. 4, the step consists of a process of chemical reaction S320 for forming thermoelectric material by elevating temperature of the above mixed solution by 10° C. per minute up to 250° C. to 280° C. and maintaining the temperature for 2 hours, and a process of fabricating mixed powder S340 for fabricating mixed powder in which carbon nanotubes are placed around the formed thermoelectric material.

Figure 5:
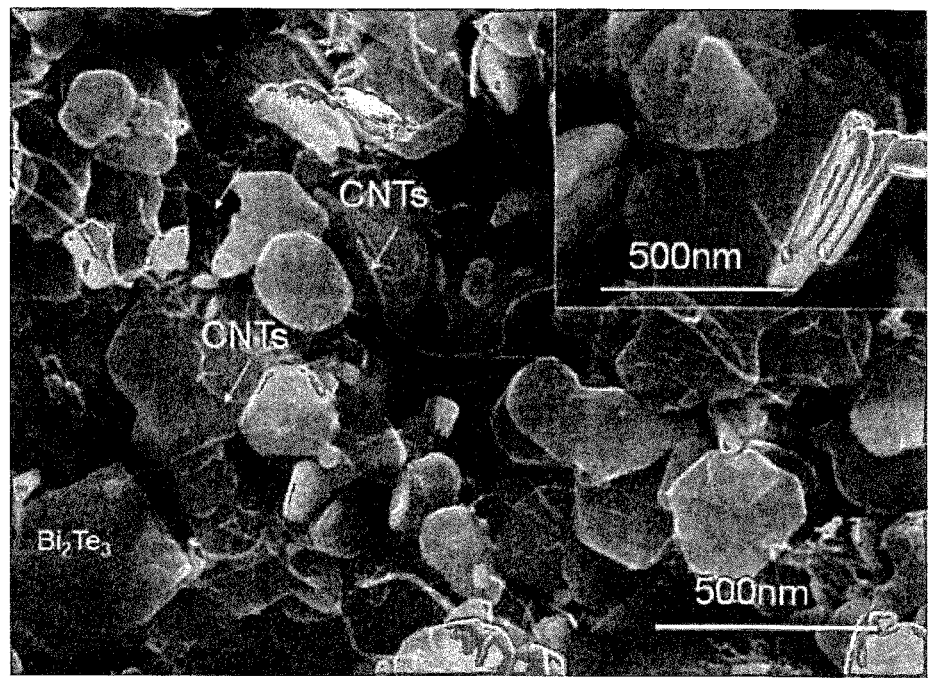
FIG. 5 is an enlarged photograph showing mixed powder fabricated in a step of the method for fabricating the thermoelectric material according to the present invention, that is, a step of fabricating mixed powder.

The mixed powder formed in the above process of fabricating mixed powder S340 comprises carbon nanotubes mixed among metallic nano powder $Bi_2Te_3$ having flake form as shown in attached FIG. 5.

Since bismuth Bi ions and tellurium Te ions nucleate to be bismuth Bi atoms and tellurium Te atoms by electrons provided from reductant during the above process of chemical reaction S320, forming $Bi_2Te_3$. During the reaction, dense sides, which are the most stable directions in energy, grow first and the mixed powder gets to have flake form.

After the above process of fabricating mixed powder S340, a powder separating process for separating mixed powder S360 and a powder drying process S380 for drying the separated mixed powder are sequentially performed.

The step of fabricating mixed powder S300 is completed according to the above processes, and the above mixed powder becomes nano metallic powder in a form where carbon nanotubes are inserted inside thermoelectric phases through the step of grinding mixed powder S400, then, performed is the step of fabricating thermoelectric material S500 for removing oxygen, oxides, and organic matters included in the above mixed powder by heat treatment in reducing atmosphere to complete fabrication of thermoelectric material.

Figure 6:
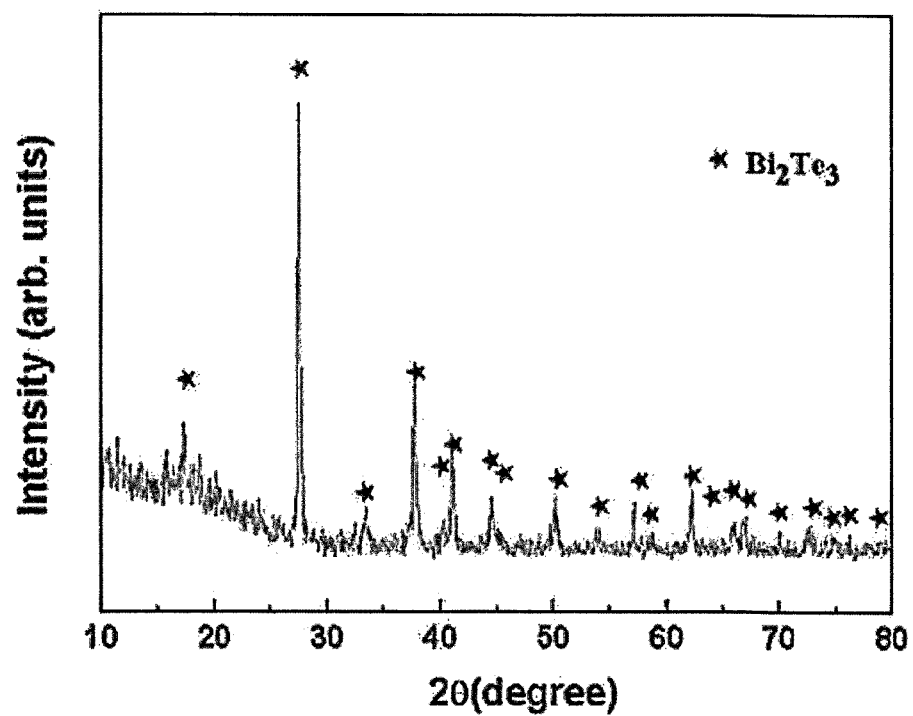
FIG. 6 is a result from the XRD of the thermoelectric material according to the present invention.

At this point, the thermoelectric material becomes powder having circular form as shown in FIG. 1, and $Bi_2Te_3$ phase can be verified through the XRD result of the thermoelectric material according to the present invention as shown in FIG. 6.

Hereinafter, a composite made from the thermoelectric material according to the present invention and a method for fabricating the same will be described in detail referring to attached FIGS. 7 to 13.

First, the composition of composite made from the thermoelectric material according to the present invention will be described referring to FIGS. 7 and 8.

Figure 7:
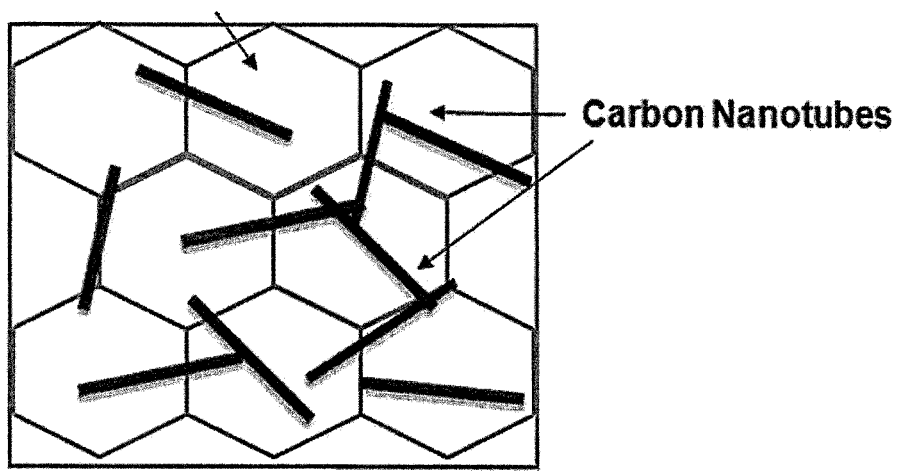
FIG. 7 is a schematic diagram showing the structure of a composite made from the thermoelectric material according to the present invention.
Figure 8:
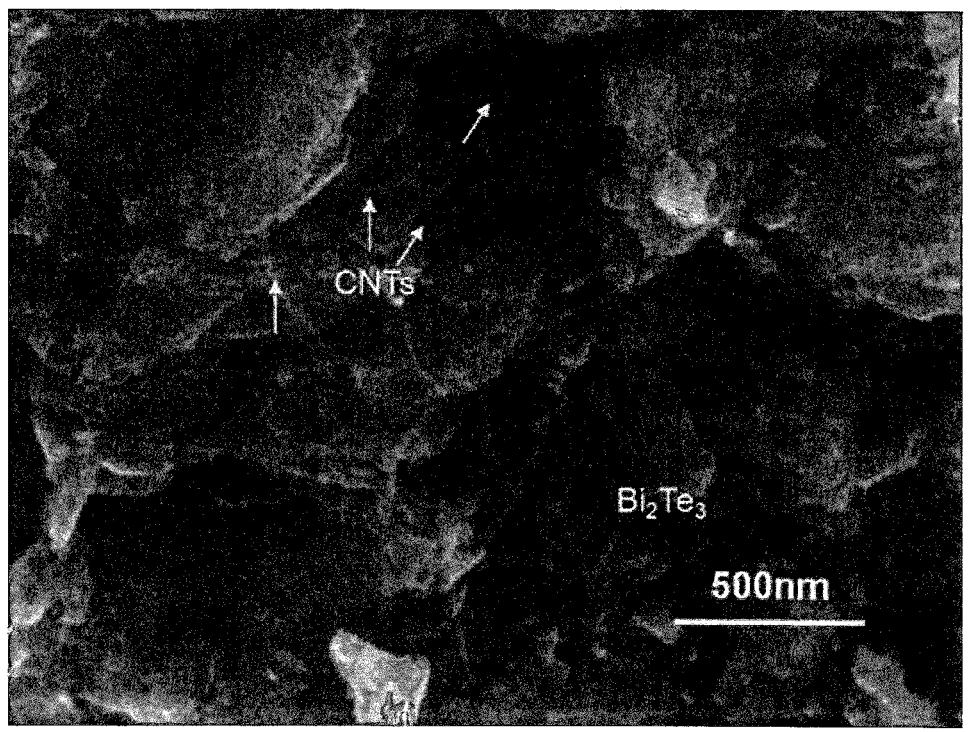
FIG. 8 is an enlarged photograph showing a composite made from the thermoelectric material according to the present invention.

FIG. 7 is a schematic diagram showing a structure of a composite made from the thermoelectric material according to the present invention and FIG. 8 is an enlarged photograph showing a composite made from the thermoelectric material according to the present invention.

As shown in figures, in the composite according to the present invention, carbon nanotubes three-dimensionally form a conductive network on a matrix of $Bi_2Te_3$ family nanocrystals, and the thermal conductivity decreases because phonons are scattered by carbon nanotubes, but the thermoelectric efficiency is improved because of the excellent conductivity of carbon nanotubes.

Further, as shown in FIG. 8, it can be verified that carbon nanotubes are randomly dispersed in composite powder of the embodiment according to the present invention containing carbon nanotubes.

Hereinafter, a method for fabricating the above composite is described referring to FIG. 9.

Figure 9:
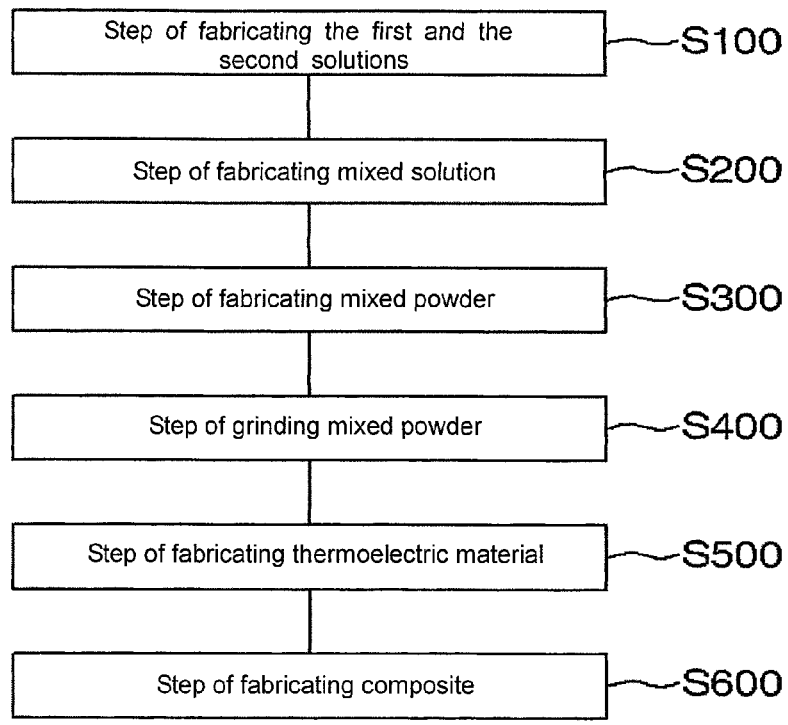
FIG. 9 is a flow chart of processes showing a method for fabricating a composite made from the thermoelectric material according to the present invention.

FIG. 9 is a flow chart of processes showing a method for fabricating a composite made from the thermoelectric material according to the present invention, and the composite according to the present invention is fabricated by sintering thermoelectric material fabricated according to the processes shown in FIG. 2.

That is, the composite can be fabricated by performing the step of fabricating composite S600 after the above step of fabricating thermoelectric material S500, and the above step of fabricating composite S600 is a process for fabricating composite by applying the spark plasma sintering process to thermoelectric material.

The above spark plasma sintering process is a process to bulk thermoelectric material in powder state using Joule's heat-generated when sending a pulsed direct current having high density to the above thermoelectric material.

Accordingly, similar characteristic to a specimen vacuum sintered for a long time can be obtained because of the rapid temperature elevating speed and short sintering time.

More particularly, since the rapid temperature elevating speed inhibits the growth of crystals, it is appropriate to fabricate material of nanocrystal. Accordingly, the spark plasma sintering process is used to sinter the above thermoelectric material to be made composite in the step of fabricating composite S600 of the present invention.

In an embodiment according to the present invention, the step of fabricating composite S600 is performed at the temperature within 300 to 350° C. for 5 to 10 minutes to restrain crystals of thermoelectric phases of bismuth telluride with maintaining dispersion of carbon nanotubes.

A reason to limit the range of temperature as the above is that in the case of exceeding the highest temperature of the above range, the growing speed of crystal of thermoelectric matrix increases, so it is hard to maintain nanocrystals. In addition, in the case of sintering at the temperature under the lowest one of the above range, the sintering density does not increase and thermoelectric material does not completely fuse together.

As shown in the below Table, when fabricating composite at 250° C. of sintering temperature, the composite has more than 10% of porosity, but the composite fabricated at 300° C. of sintering temperature shows less than 5% of porosity.

Accordingly, to maintain a proper porosity and nano-sized crystal in the above step of fabricating composite of the embodiment according to the present invention, 300° C. of sintering temperature is the most preferable.

TABLE

Change of relative density of thermoelectric material in response to the temperature of the spark plasma sintering

| Specimen composed in the present invention | Sintering temperature | Sintering time | Sintering pressure | Relative density |
|---|---|---|---|---|
| Carbon nanotube/$Bi_2Te_3$ nanopowder | 250° C. | 5 minutes | 50 MPa | 89.0% |
|  | 300° C. | 5 minutes | 50 MPa | 95.0% |
| $Bi_2Te_3$ nanopowder in flake form | 250° C. | 5 minutes | 50 MPa | 91.0% |
|  | 300° C. | 5 minutes | 50 MPa | 95.5% |

Hereinafter, characteristics of the composite according to the present invention and the one of an example for comparison will be compared and described referring to FIGS. 10 to 13.

FIGS. 10 to 13 are graphs of electrical resistivity, Seebeck coefficient, thermal conductivity, and figure-of-merit ZT comparing the composite in FIG. 8 containing carbon nanotubes and the composite of an example for comparison not containing carbon nanotubes with each other.

FIGS. 10 to 13 show data comparing characteristics in response to addition of carbon nanotubes to compare characteristics of thermoelectric material containing carbon nanotubes of the embodiment according to the present invention and thermoelectric material not containing carbon nanotubes of the example for comparison, and the composites are fabricated by the spark plasma sintering process.

Figure 10:
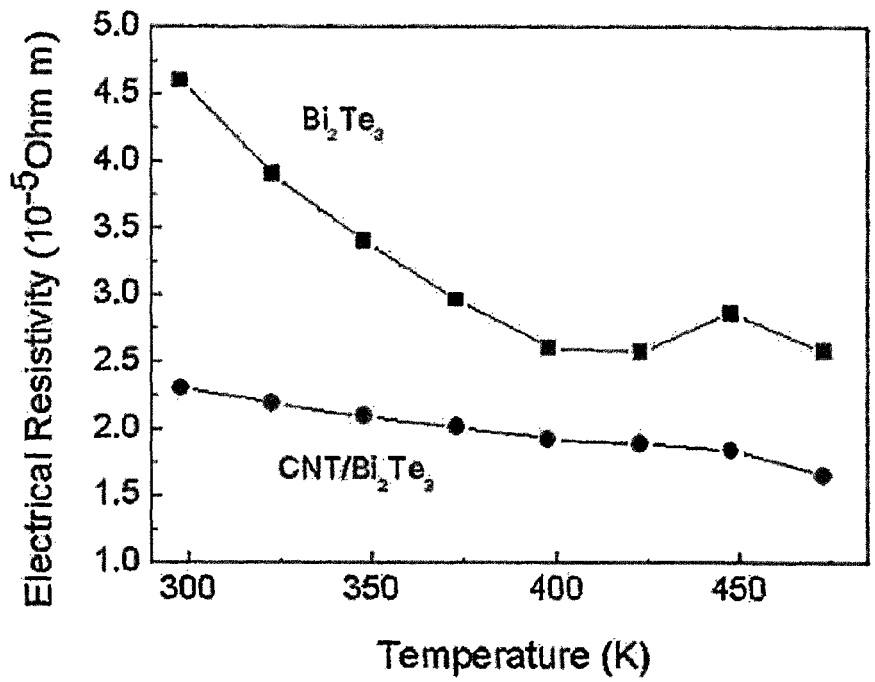
FIG. 10 is a graph comparing the electrical resistivity of the composite of the FIG. 8 with that of an example for comparison not containing carbon nanotubes.

First, as shown in FIG. 10, it is verified that the composite of the embodiment according to the present invention containing carbon nanotubes randomly dispersed has noticeably low electrical resistivity compared with that of the example for comparison not containing carbon nanotubes.

Accordingly, it is proved that contained carbon nanotubes have a great effect to increase electrical conductivity.

Figure 11:
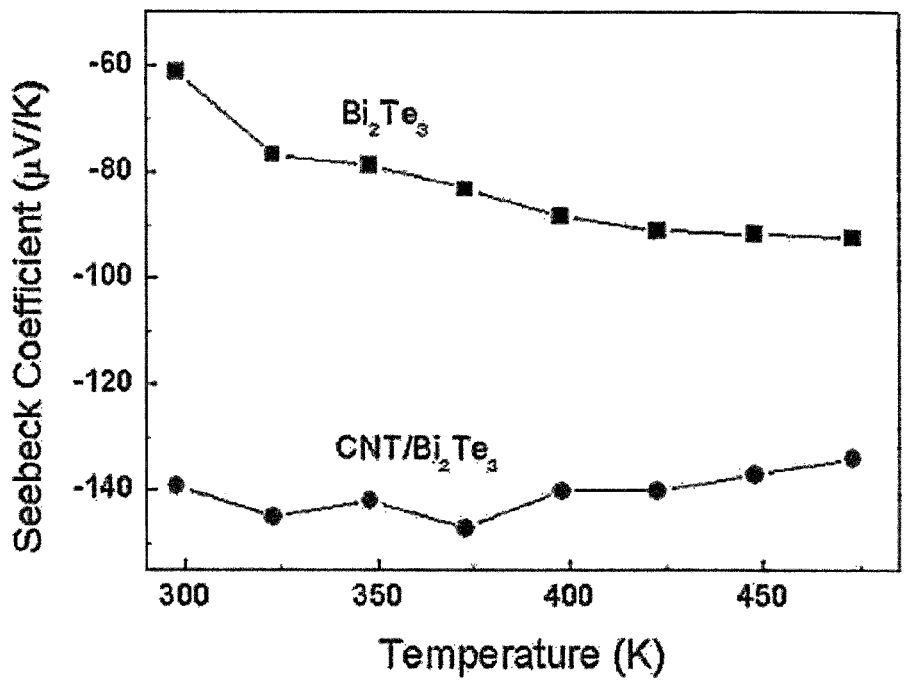
FIG. 11 is a graph comparing the Seebeck coefficient of the composite of the FIG. 8 with that of an example for comparison not containing carbon nanotubes.

In addition, if comparing Seebeck coefficients of the embodiment and the example for comparison referring to FIG. 11, the composite made from the thermoelectric material fabricated according to the embodiment has a Seebeck coefficient about twice improved than that of the composite according to the example for comparison.

This can be interpreted as an effect that high charge density provided from carbon nanotubes changes the state density of electrons when carbon nanotubes are dispersed and form a network inside the thermoelectric matrix according to the present invention.

Figure 12:
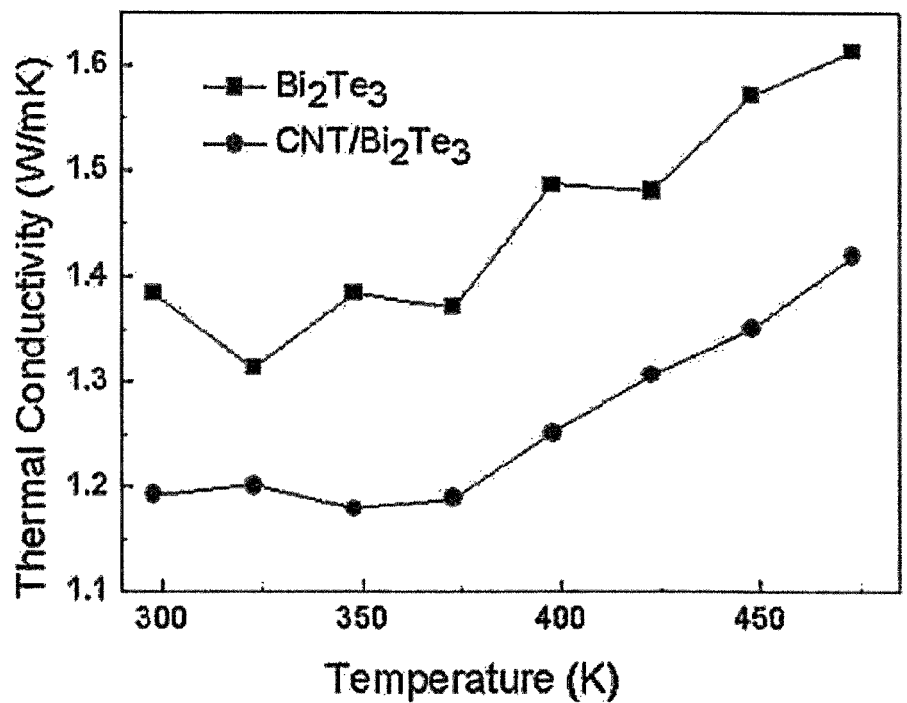
FIG. 12 is a graph comparing the thermal conductivity of the composite of the FIG. 8 with that of an example for comparison not containing carbon nanotubes.

As shown in FIG. 12, the composite according to the embodiment has relatively lower thermal conductivity than that of the example for comparison and this is because the scattering of phonon is actively generated because of the dispersion of carbon nanotubes.

Figure 13:
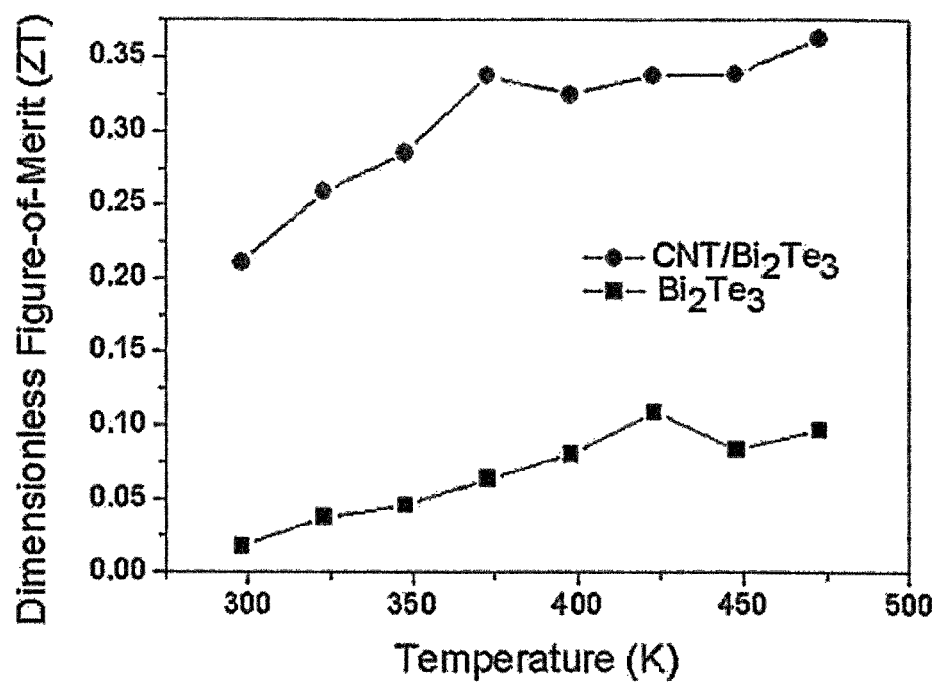
FIG. 13 is a graph comparing the figure-of-merit (ZT) of the composite of the FIG. 8 with that of an example for comparison not containing carbon nanotubes.

Lastly, as shown in FIG. 13, the composite according to the embodiment shows a figure-of-merit ZT about ten times improved when compared with bismuth telluride, which is an example for comparison.

The embodiments of the present invention described until now are just concrete examples of technical ideas of the present invention and the treatment condition such as temperature, time, and volume fraction of carbon nanotubes in the fabricating processes can be selectively changed by persons of ordinary skill in the art.

DESCRIPTION OF REFERENCE NUMBERS

| S100. | Step of fabricating the first and the second solutions |
| S120. | Purification process |
| S140. | Functionalization process |
| S160. | Extraction process |
| S180. | Dispersion process |
| S200. | Step of fabricating mixed solution |
| S300. | Step of fabricating mixed powder |
| S320. | Process of chemical reaction |
| S340. | Process of fabricating mixed powder |
| S360. | Process of separating powder |
| S380. | Process of drying powder |
| S400. | Step of grinding mixed powder |
| S500. | Step of fabricating thermoelectric material |
| S600. | Step of fabricating composite |

What is claimed is:

1. A thermoelectric material, comprising:
a mixed powder; and
carbon nanotubes dispersed within and embedded inside the mixed powder,
wherein the carbon nanotubes are dispersed within and embedded inside the mixed powder by mechanically grinding, mixing, and treating with heat the mixed powder,
wherein the mixed powder is formed by a chemical reaction between a first solution in which the carbon nanotubes are dispersed and a second solution having metallic salts, and
wherein said mixed powder comprises tellurium (Te) and bismuth (Bi), and further comprises one or both of antimony (Sb) and selenium (Se).

2. The thermoelectric material according to claim 1, wherein said carbon nanotubes are multi-walled carbon nanotubes.

3. The thermoelectric material according to claim 1, wherein the thermoelectric material comprises 1 to 10% volume fraction of said carbon nanotubes.

4. A composite of thermoelectric material, the composite comprising thermoelectric material and formed by passing the thermoelectric material through a spark plasma sintering process, wherein the thermoelectric material comprises:
a mixed powder; and
carbon nanotubes dispersed within and embedded inside the mixed powder,
wherein the carbon nanotubes are dispersed within and embedded inside the mixed powder through mechanical pulverization, mixture, and treatment by heating of the mixed powder,
wherein the mixed powder is formed by a chemical reaction after mixing a first solution in which the carbon nanotubes are dispersed and a second solution containing metallic salts, and
wherein said mixed powder comprises tellurium (Te) and bismuth (Bi), and further comprises one or both of antimony (Sb) and selenium (Se).

5. The composite according to claim 4, wherein said carbon nanotubes are multi-walled carbon nanotubes.

* * * * *